(12) United States Patent
Hoffmann

(10) Patent No.: US 9,171,549 B2
(45) Date of Patent: Oct. 27, 2015

(54) AUTOMATIC CONFIGURATION OF METADATA FOR USE IN MIXING AUDIO PROGRAMS FROM TWO ENCODED BITSTREAMS

(75) Inventor: Michael D. Hoffmann, Pacifica, CA (US)

(73) Assignee: Dolby Laboratories Licensing Corporation, San Francisco, CA (US)

(*) Notice: Subject to any disclaimer, the term of this patent is extended or adjusted under 35 U.S.C. 154(b) by 165 days.

(21) Appl. No.: 14/009,297

(22) PCT Filed: Apr. 2, 2012

(86) PCT No.: PCT/US2012/031791
§ 371 (c)(1),
(2), (4) Date: Oct. 1, 2013

(87) PCT Pub. No.: WO2012/138594
PCT Pub. Date: Oct. 11, 2012

(65) Prior Publication Data
US 2014/0025389 A1      Jan. 23, 2014

Related U.S. Application Data

(60) Provisional application No. 61/473,346, filed on Apr. 8, 2011.

(51) Int. Cl.
*G10L 19/00* (2013.01)
*G10L 21/04* (2013.01)
*G10L 19/008* (2013.01)
*H03G 5/00* (2006.01)
*H03G 5/18* (2006.01)

(52) U.S. Cl.
CPC .............. *G10L 19/00* (2013.01); *G10L 19/008* (2013.01); *H03G 5/005* (2013.01); *H03G 5/18* (2013.01)

(58) Field of Classification Search
None
See application file for complete search history.

(56) References Cited

U.S. PATENT DOCUMENTS

| | | | |
|---|---|---|---|
| 6,877,134 B1 | 4/2005 | Fuller | |
| 7,415,120 B1 * | 8/2008 | Vaudrey | H03G 3/32 381/109 |
| 8,165,321 B2 * | 4/2012 | Paquier et al. | 381/119 |
| 8,284,960 B2 * | 10/2012 | Vaudrey | H03G 7/002 381/106 |
| 8,620,465 B2 * | 12/2013 | Van Den Berghe | G10L 19/008 381/22 |
| 8,903,729 B2 * | 12/2014 | Riedmiller et al. | 704/500 |
| 2003/0210794 A1 * | 11/2003 | Sato | H04S 3/02 381/22 |
| 2006/0271355 A1 | 11/2006 | Wang | |

(Continued)

FOREIGN PATENT DOCUMENTS

| CN | ZL200910138855.X | 10/2009 |
|---|---|---|
| CN | ZL201010166094.1 | 9/2010 |

(Continued)

OTHER PUBLICATIONS

ATSC "Digital Audio Compression Standard" (AC-3, E-AC-3), Nov. 22, 2010, published by the Advanced Television Systems Committee, Inc., Washington, D.C.

(Continued)

*Primary Examiner* — Satwant Singh

(57) ABSTRACT

An audio coding system uses mixing metadata to control the attenuation of a main audio program that is subsequently mixed with an associated audio program. The value of the attenuation is calculated by analyzing the estimated loudness of the main and associated audio programs.

21 Claims, 2 Drawing Sheets

(56) References Cited

U.S. PATENT DOCUMENTS

| | | |
|---|---|---|
| 2006/0287744 A1 | 12/2006 | Kim |
| 2008/0059160 A1 | 3/2008 | Saunders |
| 2008/0298219 A1 | 12/2008 | Yamagata |
| 2009/0066839 A1* | 3/2009 | Jung et al. .................... 348/565 |
| 2009/0210238 A1 | 8/2009 | Kim |
| 2009/0222118 A1 | 9/2009 | Oh |
| 2009/0245539 A1 | 10/2009 | Vaudrey |
| 2010/0014692 A1 | 1/2010 | Schreinder |
| 2010/0083344 A1 | 4/2010 | Schildbach |
| 2010/0145487 A1 | 6/2010 | Oh |
| 2011/0064249 A1 | 3/2011 | Jang |
| 2012/0328115 A1* | 12/2012 | Wolters et al. .................. 381/57 |
| 2014/0294200 A1* | 10/2014 | Baumgarte ............. H03G 3/20 381/107 |

FOREIGN PATENT DOCUMENTS

| | | |
|---|---|---|
| EP | 0798869 | 10/1997 |
| JP | 2005-032425 | 2/2005 |
| WO | 96/37048 | 11/1996 |
| WO | 00/60746 | 10/2000 |
| WO | 01/65888 | 9/2001 |
| WO | 2006/113062 | 10/2006 |
| WO | 2008/100099 | 8/2008 |
| WO | 2009/027923 | 3/2009 |
| WO | 2010/053728 | 5/2010 |

OTHER PUBLICATIONS

Moore, et al. "A Model for the Prediction of Thresholds, Loudness and Partial Loudness", J. Audio Eng. Soc., vol. 45, No. 4, Apr. 1997.
Glasberg, et al. "A Model of Loudness Applicable to Time-Varying Methods", J. Audio Eng. Soc, vol. 50, No. 5, May 2002.
Advanced Audio Coding in ISO/IEC Standards 13818 and 14496.
Robinson, C. et al. "Dynamic Range Control via Metadata" AES Convention Sep. 1999.
Kim, Y.T. et al. "A Way of Multiplexing TV-Anytime Metadata and AV Contents to Provide Personalized Services in Digital Broadcasting" vol. 2849, pp. 148-155, published in 2003.
Caselton, James "Dolby Pulse-Combining the Merits of Dolby Digital and HE-AAC" published on Dec. 2, 2008, published by European Broadcasting Union.
Fielder, L. et al. "Introduction to Dolby Digital Plus, an Enhancement to the Dolby Digital Coding System" 117th Convention of AES, Audio Engineering Soc. San Francisco, CA Oct. 28-31, 2004.
Vlaicu, R. et al. "Advanced Audio for Advanced IPTV Services" AES Convention 123, Oct. 2007, New York, USA.
Cossette S.G. et al. "New Techniques for Audio Metadata Use and Distribution", Proc. of the Audio Engineering Convention Society, AES 117th, vol. 117, Sep. 24, 1999, pp. 1-11.
Borgato, A. et al. "Sound for HD-Creating Audio That Lives Up to the Picture" International Broadcasting Conference, Amsterdam, Sep. 9, 2005.
Skovenborg E. et al. "Loudness Descriptors to Characterize Programs and Music Tracks" AES Convention 125, Oct. 2008, AES, New York, USA.
Camerer F. et al. "The Step Into the Light the EBU Loudness Standard R128" International Broadcasting Conference, Amsterdam, Sep. 9, 2010.
IEC 60804 (Oct. 2000) "Integrating-Averaging Sound Level Meters" published by the International Electrotechnical Commission (IEC).
International Standard 532 (1975) "Method for Calculating Loudness Level" published by the International Organization for Standardization.

* cited by examiner

AUTOMATIC CONFIGURATION OF METADATA FOR USE IN MIXING AUDIO PROGRAMS FROM TWO ENCODED BITSTREAMS

CROSS-REFERENCE TO RELATED APPLICATIONS

This application claims priority to U.S. Patent Provisional Application No. 61/473,346, filed 8 Apr. 2011, hereby incorporated by reference in its entirety.

TECHNICAL FIELD

The present invention pertains generally to digital audio coding methods and systems and pertains more specifically to the generation of metadata used to mix audio programs obtained from two encoded digital bitstreams.

BACKGROUND ART

Encoded signals that conform to the so-called Dolby Digital Plus standard contain data representing a main audio program and may contain data representing one or more associated audio programs. The Dolby Digital Plus standard is described in Document A/52, "Digital Audio Compression Standard (AC-3, E-AC-3)," Nov. 22, 2010, published by the Advanced Television Systems Committee, Inc. (ATSC), Washington, D.C. The associated audio programs may contain aural content in different languages, vocal commentary on accompanying visual content, or aural content for visually-impaired listeners that describes the accompanying visual content.

The associated audio programs may be mixed with the main audio program during playback of the main audio program and its accompanying visual content. Mixing metadata that is included with an associated audio program specify an amount of attenuation for the main audio program when the associated audio program is mixed with the main audio program.

DISCLOSURE OF INVENTION

It is an object of the present invention to provide for mixing metadata that specify attenuation of a main audio program that is adapted to optimize the listening experience when a mixing of main and associated audio programs occurs. The mixing metadata preferably specify no attenuation if associated audio program material is not present or is not to be mixed with the main audio program, and preferably specify a fade in and fade out of attenuation to avoid abrupt changes in main program loudness levels.

According to one aspect of the present invention, audio signals are encoded by receiving one or more main audio signals that represent a main audio program and receiving one or more associated audio signals that represent an associated audio program; encoding the one or more main audio signals to generate a main encoded audio signal and encoding the one or more associated audio signals to generate an associated encoded audio signal; generating audio mixing metadata in response to estimated loudness of the main audio program and estimated loudness of the associated audio program, wherein one or more audio signals to be decoded from the main encoded audio signal and one or more audio signals to be decoded from the associated audio signal are to be mixed according to the audio mixing metadata; and assembling the main encoded audio signal, the associated encoded audio signal and the audio mixing metadata into an output encoded signal.

According to another aspect of the present invention, an input encoded signal is decoded by receiving the input encoded signal and obtaining therefrom a main encoded audio signal, an associated encoded audio signal and mixing metadata; decoding the main encoded audio signal to obtain one or more main audio signals and decoding the associated encoded audio signal to obtain one or more associated audio signals; and mixing the one or more main audio signals with the one or more associated audio signals according to the mixing metadata to generate an output audio signal, wherein the mixing metadata was generated in response to estimated loudness of a main audio program represented by the main encoded audio signal and estimated loudness of an associated audio program represented by the associated encoded audio signal.

The various features of the present invention and its preferred embodiments may be better understood by referring to the following discussion and the accompanying drawings in which like reference numerals refer to like elements in the several figures. The contents of the following discussion and the drawings are set forth as examples only and should not be understood to represent limitations upon the scope of the present invention.

MODES FOR CARRYING OUT THE INVENTION

A. Introduction

The present invention is directed toward controlling the amplitudes of a main audio program and one or more associated audio programs that are obtained by decoding an encoded signal and subsequently mixing them together for playback. In one exemplary application, one or more main audio signals represent a main audio program such as dialog and sound effects for motion picture and one or more associated audio signals that represent an associated audio program such as a director commentary or a narrative for the sight impaired that describes the visual content of the motion picture. Many other examples are possible. The present invention is not limited to any particular type of audio content.

The present invention may be implemented in a variety of ways. A first type of implementation incorporates aspects of the present invention into a transmitter and into a receiver of an audio coding system. An exemplary transmitter and receiver for the first type of implementation are shown schematically in FIGS. 1 and 2, respectively.

A second type of implementation incorporates aspects of the present invention into only a receiver. An exemplary receiver for the second type of implementation is shown schematically in FIG. 3. This second type of implementation is discussed below after the first type of implementation is discussed.

B. Transmitter and Receiver

1. Transmitter

Figure 1:
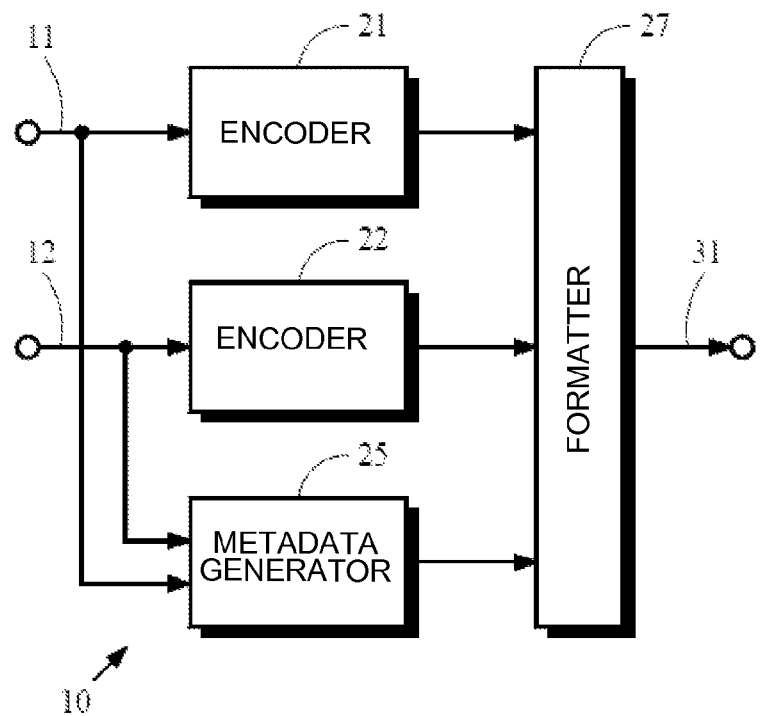
FIG. 1 is a schematic block diagram of an encoder/transmitter that incorporates various aspects of the present invention.

Referring to FIG. 1, the transmitter 10 receives one or more main audio signals that represent a main audio program from the path 11 and receives one or more associated audio signals that represent an associated audio program from the path 12.

The encoder 21 encodes the one or more main audio signals to generate a main encoded audio signal and the encoder 22 encodes the one or more associated audio signals to generate an associated encoded audio signal. The encoder 21 and the encoder 22 may use essentially any type of encoding process that may be desired. For example, a split-band perceptual coding process may be used in which an audio signal is split into frequency subband signals, the frequency subband signals are analyzed to estimate psychoacoustic masking effects, and the frequency subband signals are quantized with quantizing resolutions that are adapted so that quantization noise levels are just below the estimated psychoacoustic masking levels. A wide variety of subband filters and/or transforms may be used to split the audio signal into frequency subband signals. Examples of perceptual coding processes that may be used include Dolby Digital, sometimes referred to as AC-3, described in the ATSC A/52 document cited above, and variations of Advanced Audio Coding (AAC) described in ISO/IEC standards 13818 and 14496. Lossless coding processes may be used such as those described in international patent application publications WO 96/37048 published Nov. 21, 1996, and WO 00/60746 published Oct. 12, 2000, and arithmetic coding, Huffman encoding and conventional pulse code modulation. No particular encoding process is essential to the present invention.

The metadata generator 25 generates audio mixing metadata in response to estimated loudness of the main audio program and estimated loudness of the associated audio program. Ways in which the metadata generator 25 may be implemented are described below.

The formatter 27 assembles the main encoded audio signal, the associated encoded audio signal and the audio mixing metadata into an output encoded signal that is passed along the path 31. The output encoded signal may be arranged in frames or segments that convey encoded audio signals and mixing metadata that correspond to or represent intervals of audio signals. The encoded output signal may be delivered directly to one or more receivers such as is done in a broadcast application or it may be recorded on a storage medium for subsequent delivery to one or more receivers.

a) Metadata Generator

The metadata generator 25 generates one or more mixing parameters from an analysis of the estimated loudness of the main audio program and the associated audio program. The estimated loudness of an audio signal may be derived from some mathematical model of the human auditory system or it may be calculated directly from signal amplitude. Many methods of estimating loudness are known. A few methods are described below.

(1) Estimating Loudness

The metadata generator 25 may use essentially any method for estimating loudness that may be desired. The choice of method may affect performance but no particular method is essential to practice the present invention.

One method that may be used to calculate an estimated loudness level of an audio signal is described in international standard IEC 60804 (2000-10) entitled "Integrating-averaging sound level meters" published by the International Electrotechnical Commission (IEC). This standard describes a measurement based on frequency-weighted and time-averaged sound-pressure levels.

Another method is described in international standard 532 (1975) entitled "Method for calculating loudness level" published by the International Organization for Standardization. This standard describes methods that obtain a measure of loudness from a combination of power levels calculated for frequency subbands.

Examples of psychoacoustic models that may be used to estimate loudness are described in Moore, Glasberg and Baer, "A model for the prediction of thresholds, loudness and partial loudness," J. Audio Eng. Soc., vol. 45, no. 4, April 1997, and in Glasberg and Moore, "A model of loudness applicable to time-varying sounds," J. Audio Eng. Soc., vol. 50, no. 5, May 2002.

Yet another method calculates estimated loudness from the root-mean-square (RMS) of amplitude for intervals of the audio signal. Empirical tests have shown that intervals of approximately 500 msec. provide useful measures of estimated loudness for one exemplary coding system that complies with the Dolby Digital Plus standard mentioned above.

The following discussion assumes a loudness calculation method is used that derives a measure of loudness expressed in dB. The reference level that corresponds to 0 dB is not important but, if the digital audio signals are represented by fixed-length digital values, a convenient choice is to have 0 dB correspond to the maximum possible digital value. A different reference level may be chosen if desired without affecting the following discussion.

(2) Analyzing Loudness

According to one implementation, the metadata generator 25 obtains an estimated loudness $L_M$ of the main audio program by applying a loudness calculation method to the one or more main audio signals and obtains an estimated loudness $L_A$ of the associated audio program by applying a loudness calculation method to the one or more associated audio signals. The estimated loudness of the associated audio program is compared to a loudness level that is some threshold amount $T_D$ above the estimated loudness of the main audio program.

If the estimated loudness of the associated audio program is less than this loudness level, the metadata generator 25 generates a parameter that specifies an attenuation level for the main audio program when mixing occurs.

If the estimated loudness of the associated audio program is greater than or equal to this loudness level, the metadata generator 25 may generate a parameter that specifies no attenuation for the main audio program. Alternatively, the metadata generator 25 may not generate any parameter if the receiver in the audio coding system is configured to respond correctly when no attenuation parameter is specified.

This implementation may be expressed as:

$$A = \begin{cases} 0 \text{ dB} & \text{when } L_A \geq L_M + T_D \\ X \text{ dB} & \text{when } L_A < L_M + T_D \end{cases} \quad (1)$$

where A=is the desired level of attenuation for the main audio program.

The value for the threshold $T_D$ may be derived empirically. A threshold value of $T_D$=23 dB has been used to good effect for the exemplary coding system mentioned above.

The value for X may be calculated in a variety of ways and the appropriate value can be identified empirically but no particular way is essential. For the exemplary coding system mentioned above, the attenuation level may be calculated from the following expression:

$$X = L_A - L_M - T_D \text{ when } L_A < L_M + T_D \quad (2)$$

Alternatively, the attenuation level A may be loudness-level dependent. This may be expressed as two or more attenuation levels and one or more knee points between respective pairs of the attenuation levels. No particular set of values is critical to the present invention. One set of attenuation levels and associated knee points that have been used advantageously with the exemplary coding system mentioned above is expressed in terms of compression ratios. In this example, a compression ratio of 2:1 is used below the knee point and a compression ratio of 3:1 is used above the knee point. The knee point is 6 dB above the level $L_M + T_D$.

In yet another implementation, the metadata generator 25 generates an attenuation parameter in response to one or more parameters in a set of parameters that specify time intervals for $I_D$ delay, $I_H$ hold, $I_A$ attack and $I_R$ release of attenuation. No particular values for these time intervals are critical to the present invention. One set of values that have been used advantageously with the exemplary coding system mentioned above is $I_D$=0 msec., $I_H$=200 msec., $I_A$=320 msec. and $I_R$=640 msec.

Preferably, the metadata generator 25 in the implementations described above generates an attenuation parameter only if the estimated loudness of the associated audio program is higher than a threshold trigger level $T_T$. This threshold trigger level can be derived empirically. A value that has been used in the exemplary coding system is $T_T$=−40 dB.

Alternatively, the metadata generator 25 may generate a set of parameters that specify one or more levels of attenuation, associated knee points if more than one attenuation level is specified, and/or one or more of the time intervals discussed above. The set of parameters constitute the mixing metadata that is assembled into the output encoded signal. In this alternative implementation, the receiver calculates the desired level of attenuation in response to all of the parameters include in the mixing metadata.

2. Receiver

Figure 2:
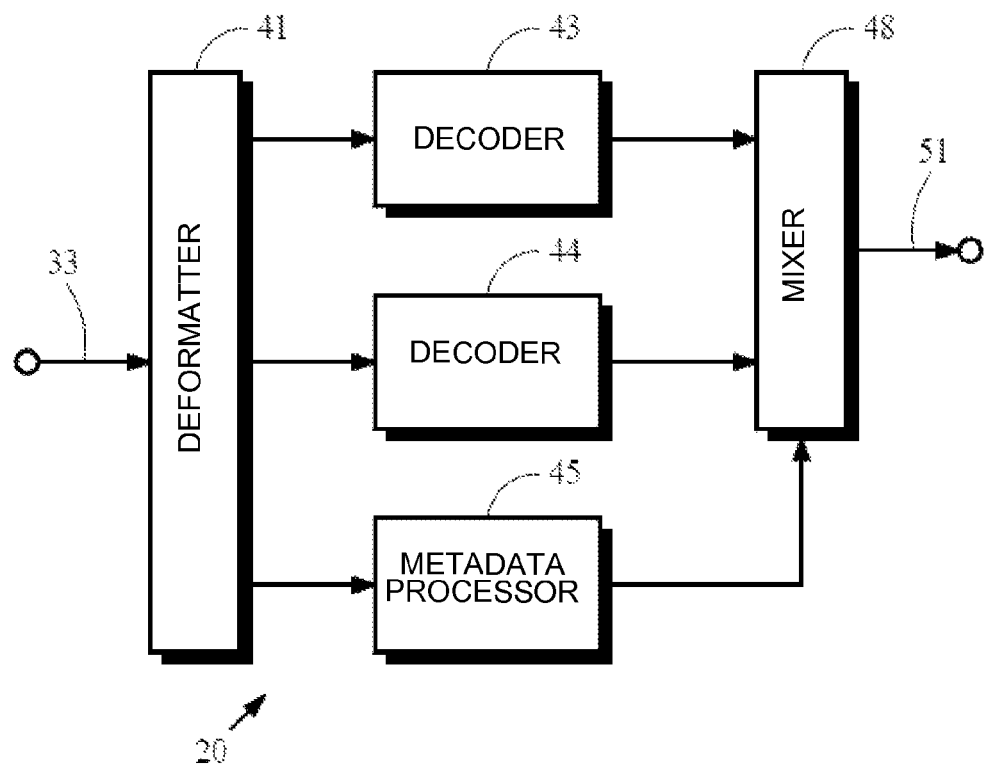
FIG. 2 is a schematic block diagram of one implementation of a receiver/decoder that incorporates various aspects of the present invention and may be used with the audio encoder shown in FIG. 1.

Referring to FIG. 2, the receiver 20 receives an input encoded signal from the path 33. For example, the input encoded signal may be received directly from a transmitter or retrieved from a storage medium. The input encoded signal may be arranged in frames or segments that convey encoded audio signals and mixing metadata that correspond to or represent intervals of audio signals. The deformatter 41 obtains from the input encoded signal a main encoded audio signal, an associated encoded audio signal and mixing metadata.

The decoder 43 decodes the main encoded audio signal to obtain one or more main audio signals and the decoder 44 decodes the associated encoded audio signal to obtain one or more associated audio signals. Although no particular decoding process is essential to practice the present invention, it should be complementary to the encoding process used to generate the main and associated encoded audio signals. For example, if a perceptual coding process like that described above was used to generate the encoded audio signal, a suitable decoding process would dequantize frequency subband signals with dequantizing resolutions that follow the quantizing resolutions used to quantize the frequency subband signals, and synthesize the dequantized frequency subband signals into a decoded audio signal. Additional details for appropriate decoding methods are either known in the art or can be obtained from the references cited above.

The metadata processor 45 generates control signals in response to the mixing metadata that control the mixer 48. The mixer 48 generates an output audio signal by adaptively mixing the one or more associated audio signals with the one or more main audio signals whose amplitude levels are controlled in response to the mixing metadata. The output audio signal is passed along the path 51 for playback or other processing as may be desired.

The mixer 48 may be implemented in a variety of ways and no particular implementation is essential to the present invention. In one implementation, the mixer 48 attenuates the one or more main audio signals by an amount specified by the mixing metadata and then mixes the attenuated main audio signals with the associated audio signals. If no mixing metadata is present in the input encoded signal, the one or more main audio signals are not attenuated prior to mixing.

In an alternative implementation, the mixer 48 responds to mixing metadata that contains a set of parameters specifying one or more levels of attenuation, associated knee points if more than one attenuation level is specified, and/or one or more of the time intervals discussed above. In this alternative implementation, the mixer 48 calculates the desired level of attenuation for the main audio signals in response to all of the parameters included in the mixing metadata.

C. Receiver Only

Figure 3:
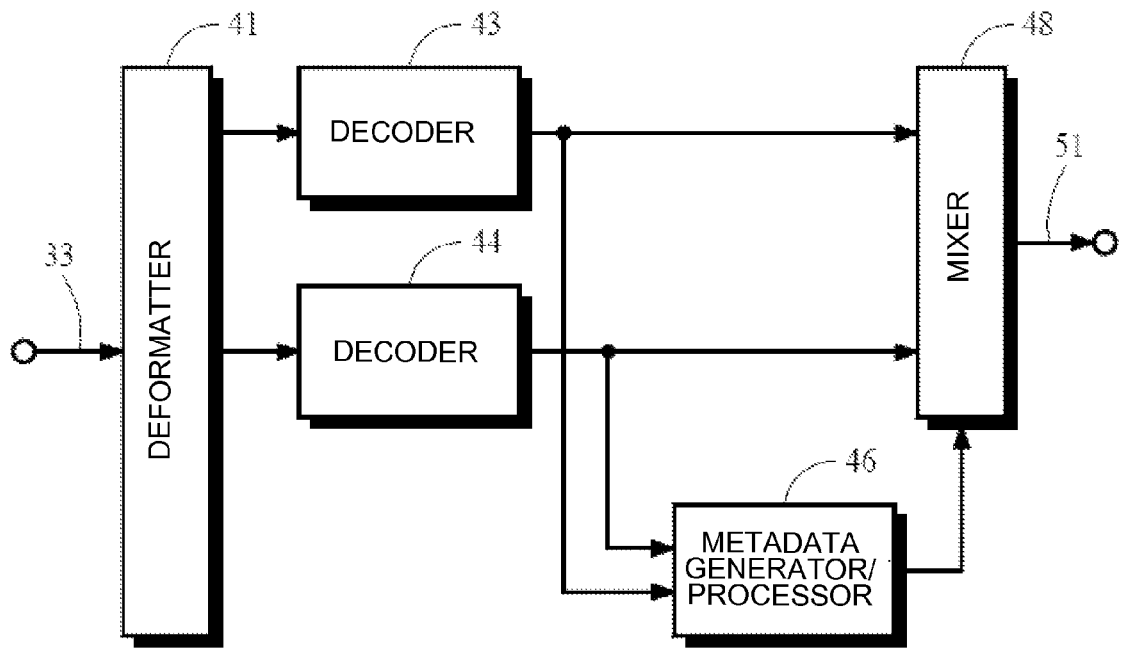
FIG. 3 is a schematic block diagram of another implementation of a receiver/decoder that incorporates various aspects of the present invention.

The receiver 30 illustrated schematically in FIG. 3 incorporates features from the transmitter 10 shown in FIG. 1 and the receiver 20 shown in FIG. 2. Each component in the receiver 30 that has the same reference number as a respective component in the transmitter 10 or the receiver 20 performs the same function as the respective component.

The metadata generator/processor 46 performs generally the same functions as those described above for the metadata generator 25 and the metadata processor 45. The estimated loudness $L_M$ of the main audio program is obtained by applying a loudness calculation method to the one or more main audio signals decoded from the main encoded audio signal and the estimated loudness $L_A$ of the associated audio program is obtained by applying a loudness calculation method to the one or more associated audio signals decoded from the associated encoded audio signal. The mixing metadata parameters are derived as described above for the metadata generator 25.

D. Implementation

Figure 4:
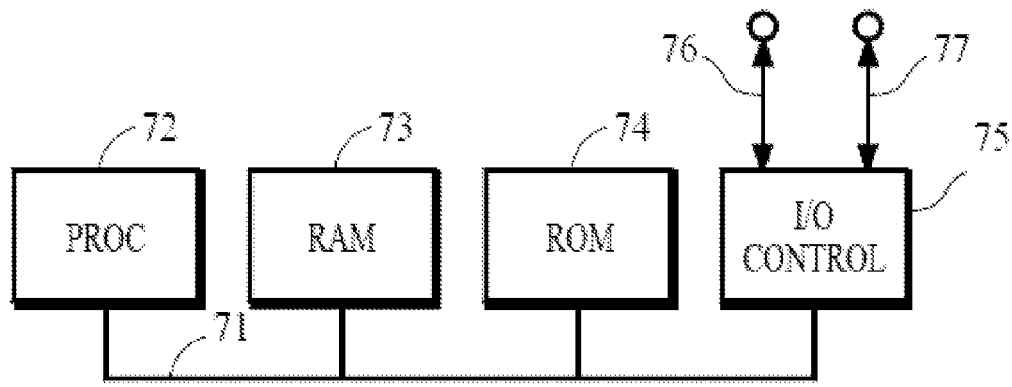
FIG. 4 is a schematic block diagram of a device that may be used to implement various aspects of the present invention.

Devices that incorporate various aspects of the present invention may be implemented in a variety of ways including software for execution by a computer or some other device that includes more specialized components such as digital signal processor (DSP) circuitry coupled to components similar to those found in a general-purpose computer. FIG. 4 is a schematic block diagram of a device 70 that may be used to implement aspects of the present invention. The processor 72 provides computing resources. RAM 73 is system random access memory (RAM) used by the processor 72 for processing. ROM 74 represents some form of persistent storage such as read only memory (ROM) for storing programs needed to operate the device 70 and possibly for carrying out various aspects of the present invention. I/O control 75 represents interface circuitry to receive and transmit signals by way of the communication channels 76, 77. In the embodiment shown, all major system components connect to the bus 71, which may represent more than one physical or logical bus; however, a bus architecture is not required to implement the present invention.

In embodiments implemented by a general purpose computer system, additional components may be included for interfacing to devices such as a keyboard or mouse and a display, and for controlling a storage device 78 having a storage medium such as magnetic tape or disk, or an optical medium. The storage medium may be used to record programs of instructions for operating systems, utilities and applications, and may include programs that implement various aspects of the present invention.

The functions required to practice various aspects of the present invention can be performed by components that are implemented in a wide variety of ways including discrete logic components, integrated circuits, one or more ASICs and/or program-controlled processors. The manner in which these components are implemented is not important to the present invention.

Software implementations of the present invention may be conveyed by a variety of machine readable media such as baseband or modulated communication paths throughout the spectrum including from supersonic to ultraviolet frequencies, or storage media that convey information using essentially any recording technology including magnetic tape, cards or disk, optical cards or disc, and detectable markings on media including paper.

The invention claimed is:

1. A method, performed by one or more devices, for encoding audio signals, wherein the method comprises:
   receiving one or more main audio signals that represent a main audio program and receiving one or more associated audio signals that represent an associated audio program;
   encoding the one or more main audio signals to generate a main encoded audio signal and encoding the one or more associated audio signals to generate an associated encoded audio signal;
   generating audio mixing metadata in response to estimated loudness of the main audio program and estimated loudness of the associated audio program, wherein one or more audio signals to be decoded from the main encoded audio signal and one or more audio signals to be decoded from the associated audio signal are to be mixed according to the audio mixing metadata; wherein the audio mixing metadata specify an attenuation level for the one or more audio signals to be decoded from the main audio program prior to mixing; and
   assembling the main encoded audio signal, the associated encoded audio signal and the audio mixing metadata into an output encoded signal.

2. The method of claim 1, wherein the audio mixing metadata are generated and assembled into the output encoded signal only when the estimated loudness of the associated audio program satisfies one criterion from a set of criteria including:
   the estimated loudness is less than a first threshold amount above the estimated loudness of the main audio program,
   the estimated loudness of the associated audio program is greater than a second threshold amount, and
   the estimated loudness is less than the first threshold amount above the estimated loudness of the main audio program and the estimated loudness of the associated audio program is greater than the second threshold amount.

3. The method of claim 1, wherein the audio mixing metadata either:
   include one or more parameters in a set of parameters that specify time intervals for delay, hold, attack and release of attenuation, and two or more attenuation levels with one or more knee points for respective pairs of the attenuation levels for the one or more audio signals to be decoded from the main audio program prior to mixing; or
   is generated in response to the one or more parameters.

4. A method, performed by one or more devices, for decoding an input encoded signal, wherein the method comprises:
   receiving the input encoded signal and obtaining therefrom a main encoded audio signal, an associated encoded audio signal and mixing metadata;
   decoding the main encoded audio signal to obtain one or more main audio signals and decoding the associated encoded audio signal to obtain one or more associated audio signals; wherein the mixing metadata specify an attenuation level for the one or more main audio signals prior to mixing; and
   mixing the one or more main audio signals with the one or more associated audio signals according to the mixing metadata to generate an output audio signal, wherein the mixing metadata was generated in response to estimated loudness of a main audio program represented by the main encoded audio signal and estimated loudness of an associated audio program represented by the associated encoded audio signal.

5. The method of claim 4, wherein the mixing metadata is present in the input encoded signal only when the estimated loudness of the associated audio program satisfies one criterion from a set of criteria including:
   the estimated loudness is less than a first threshold amount above the estimated loudness of the main audio program,
   the estimated loudness of the associated audio program is greater than a second threshold amount, and
   the estimated loudness is less than the first threshold amount above the estimated loudness of the main audio program and the estimated loudness of the associated audio program is greater than the second threshold amount.

6. The method of claim 4, wherein the mixing metadata is obtained from the input encoded signal only when the estimated loudness of the associated audio program satisfies one criterion from a set of criteria including:
   the estimated loudness is less than a first threshold amount above the estimated loudness of the main audio program,
   the estimated loudness is greater than a second threshold amount, and
   the estimated loudness is less than the first threshold amount above the estimated loudness of the main audio program and the estimated loudness is greater than the second threshold amount.

7. The method of claim 4, wherein the mixing metadata either:
   include one or more parameters in a set of parameters that specify time intervals for delay, hold, attack and release of attenuation, and two or more attenuation levels with one or more knee points for respective pairs of the attenuation levels for the one or more main audio signals prior to mixing; or was generated in response to the one or more parameters.

8. An apparatus for encoding audio signals, wherein the apparatus comprises one or more processors configured to:
receive one or more main audio signals that represent a main audio program and receiving one or more associated audio signals that represent an associated audio program;
encode the one or more main audio signals to generate a main encoded audio signal and encoding the one or more associated audio signals to generate an associated encoded audio signal;
generate audio mixing metadata in response to estimated loudness of the main audio program and estimated loudness of the associated audio program, wherein one or more audio signals to be decoded from the main encoded audio signal and one or more audio signals to be decoded from the associated audio signal are to be mixed according to the audio mixing metadata; wherein the audio mixing metadata specify an attenuation level for the one or more audio signals to be decoded from the main audio program prior to mixing; and
assemble the main encoded audio signal, the associated encoded audio signal and the audio mixing metadata into an output encoded signal.

9. The apparatus of claim 8, wherein the audio mixing metadata are generated and assembled into the output encoded signal only when the estimated loudness of the associated audio program satisfies one criterion from a set of criteria including:
the estimated loudness is less than a first threshold amount above the estimated loudness of the main audio program,
the estimated loudness of the associated audio program is greater than a second threshold amount, and
the estimated loudness is less than the first threshold amount above the estimated loudness of the main audio program and the estimated loudness of the associated audio program is greater than the second threshold amount.

10. The apparatus of claim 8, wherein the audio mixing metadata either:
include one or more parameters in a set of parameters that specify time intervals for delay, hold, attack and release of attenuation, and two or more attenuation levels with one or more knee points for respective pairs of the attenuation levels for the one or more audio signals to be decoded from the main audio program prior to mixing; or
is generated in response to the one or more parameters.

11. An apparatus for decoding an input encoded signal, wherein the apparatus comprises one or more processors configured to:
receive the input encoded signal and obtaining therefrom a main encoded audio signal, an associated encoded audio signal and mixing metadata;
decode the main encoded audio signal to obtain one or more main audio signals and decoding the associated encoded audio signal to obtain one or more associated audio signals; wherein the mixing metadata specify an attenuation level for the one or more main audio signals prior to mixing; and
mix the one or more main audio signals with the one or more associated audio signals according to the mixing metadata to generate an output audio signal, wherein the mixing metadata was generated in response to estimated loudness of a main audio program represented by the main encoded audio signal and estimated loudness of an associated audio program represented by the associated encoded audio signal.

12. The apparatus of claim 11, wherein the mixing metadata is present in the input encoded signal only when the estimated loudness of the associated audio program satisfies one criterion from a set of criteria including:
the estimated loudness is less than a first threshold amount above the estimated loudness of the main audio program,
the estimated loudness of the associated audio program is greater than a second threshold amount, and
the estimated loudness is less than the first threshold amount above the estimated loudness of the main audio program and the estimated loudness of the associated audio program is greater than the second threshold amount.

13. The apparatus of claim 11, wherein the mixing metadata is obtained from the input encoded signal only when the estimated loudness of the associated audio program satisfies one criterion from a set of criteria including:
the estimated loudness is less than a first threshold amount above the estimated loudness of the main audio program,
the estimated loudness is greater than a second threshold amount, and
the estimated loudness is less than the first threshold amount above the estimated loudness of the main audio program and the estimated loudness is greater than the second threshold amount.

14. The apparatus of claim 11, wherein the mixing metadata either:
include one or more parameters in a set of parameters that specify time intervals for delay, hold, attack and release of attenuation, and two or more attenuation levels with one or more knee points for respective pairs of the attenuation levels for the one or more main audio signals prior to mixing; or
was generated in response to the one or more parameters.

15. A non-transitory medium that records a program of instructions and is readable by a device for executing the program of instructions to perform a method for encoding audio signals, wherein the method comprises:
receiving one or more main audio signals that represent a main audio program and receiving one or more associated audio signals that represent an associated audio program;
encoding the one or more main audio signals to generate a main encoded audio signal and encoding the one or more associated audio signals to generate an associated encoded audio signal;
generating audio mixing metadata in response to estimated loudness of the main audio program and estimated loudness of the associated audio program, wherein one or more audio signals to be decoded from the main encoded audio signal and one or more audio signals to be decoded from the associated audio signal are to be mixed according to the audio mixing metadata; wherein the audio mixing metadata specify an attenuation level for the one or more audio signals to be decoded from the main audio program prior to mixing; and
assembling the main encoded audio signal, the associated encoded audio signal and the audio mixing metadata into an output encoded signal.

16. The medium of claim 15, wherein the audio mixing metadata are generated and assembled into the output encoded signal only when the estimated loudness of the associated audio program satisfies one criterion from a set of criteria including:
- the estimated loudness is less than a first threshold amount above the estimated loudness of the main audio program,
- the estimated loudness of the associated audio program is greater than a second threshold amount, and
- the estimated loudness is less than the first threshold amount above the estimated loudness of the main audio program and the estimated loudness of the associated audio program is greater than the second threshold amount.

17. The medium of claim 15, wherein the audio mixing metadata either:
- include one or more parameters in a set of parameters that specify time intervals for delay, hold, attack and release of attenuation, and two or more attenuation levels with one or more knee points for respective pairs of the attenuation levels for the one or more audio signals to be decoded from the main audio program prior to mixing; or
- is generated in response to the one or more parameters.

18. A non-transitory medium that records a program of instructions and is readable by a device for executing the program of instructions to perform a method for decoding an input encoded signal, wherein the method comprises:
- receiving the input encoded signal and obtaining therefrom a main encoded audio signal, an associated encoded audio signal and mixing metadata;
- decoding the main encoded audio signal to obtain one or more main audio signals and decoding the associated encoded audio signal to obtain one or more associated audio signals; wherein the mixing metadata specify an attenuation level for the one or more main audio signals prior to mixing; and
- mixing the one or more main audio signals with the one or more associated audio signals according to the mixing metadata to generate an output audio signal, wherein the mixing metadata was generated in response to estimated loudness of a main audio program represented by the main encoded audio signal and estimated loudness of an associated audio program represented by the associated encoded audio signal.

19. The medium of claim 18, wherein the mixing metadata is present in the input encoded signal only when the estimated loudness of the associated audio program satisfies one criterion from a set of criteria including:
- the estimated loudness is less than a first threshold amount above the estimated loudness of the main audio program,
- the estimated loudness of the associated audio program is greater than a second threshold amount, and
- the estimated loudness is less than the first threshold amount above the estimated loudness of the main audio program and the estimated loudness of the associated audio program is greater than the second threshold amount.

20. The medium of claim 18, wherein the mixing metadata is obtained from the input encoded signal only when the estimated loudness of the associated audio program satisfies one criterion from a set of criteria including:
- the estimated loudness is less than a first threshold amount above the estimated loudness of the main audio program,
- the estimated loudness is greater than a second threshold amount, and
- the estimated loudness is less than the first threshold amount above the estimated loudness of the main audio program and the estimated loudness is greater than the second threshold amount.

21. The medium of claim 18, wherein the mixing metadata either:
- include one or more parameters in a set of parameters that specify time intervals for delay, hold, attack and release of attenuation, and two or more attenuation levels with one or more knee points for respective pairs of the attenuation levels for the one or more main audio signals prior to mixing; or
- was generated in response to the one or more parameters.

* * * * *